(12) United States Patent
Yoon

(10) Patent No.: US 8,488,393 B2
(45) Date of Patent: Jul. 16, 2013

(54) SEMICONDUCTOR MEMORY DEVICE AND TEST METHOD THEREOF

(75) Inventor: Young-Jun Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 173 days.

(21) Appl. No.: 13/190,784

(22) Filed: Jul. 26, 2011

(65) Prior Publication Data

US 2012/0269005 A1  Oct. 25, 2012

(30) Foreign Application Priority Data

Apr. 21, 2011  (KR) .................. 10-2011-0037509

(51) Int. Cl.
*G11C 7/10* (2006.01)

(52) U.S. Cl.
USPC ............... 365/189.05; 365/189.02; 365/201

(58) Field of Classification Search
None
See application file for complete search history.

(56) References Cited

U.S. PATENT DOCUMENTS

| 5,202,853 | A  | * | 4/1993  | Choi ............................ 365/201 |
| 5,537,351 | A  | * | 7/1996  | Suwa et al. .............. 365/189.02 |
| 6,317,373 | B1 | * | 11/2001 | Tanimura .................... 365/201 |

FOREIGN PATENT DOCUMENTS

| JP | 09-092787    | 4/1997 |
| JP | 2003-163246  | 6/2003 |

OTHER PUBLICATIONS

Office Action issued by the Korean Intellectual Property Office on Sep. 28, 2012.

* cited by examiner

*Primary Examiner* — Tan T. Nguyen
(74) *Attorney, Agent, or Firm* — IP & T Group LLP

(57) ABSTRACT

A semiconductor memory device includes a plurality of first pads and a plurality of memory unit blocks. The plurality of first pads are configured to input/output data in a test mode. The plurality of memory unit blocks each include a plurality of second pads configured to input/output data in a normal mode, and a plurality of data path selection units configured to connect internal circuits of the corresponding memory unit block to the plurality of first pads or the plurality of second pads in response to a unit block selection flag signal, a write enable signal, a read enable signal, and a mode control signal.

23 Claims, 7 Drawing Sheets

SEMICONDUCTOR MEMORY DEVICE AND TEST METHOD THEREOF

CROSS-REFERENCE TO RELATED APPLICATIONS

The present application claims priority of Korean Patent Application No. 10-2011-0037509, filed on Apr. 21, 2011, which is incorporated herein by reference in its entirety.

BACKGROUND

1. Field

Exemplary embodiments of the present invention relate to semiconductor design technology, and more particularly, to a semiconductor device with extended bandwidth of input/output signals and a test method thereof.

2. Description of the Related Art

Semiconductor memory devices operate to use input/output (I/O) signals of wide bandwidths in order for performance improvement thereof. Therefore, the semiconductor memory devices are provided with an increasing number of I/O lines, which are referred to as multi channel wide I/O semiconductor memory devices. A multi channel wide I/O semiconductor memory device includes a plurality of memory unit blocks that can independently operate without mutual interference. The respective memory unit blocks are referred to as channels.

FIG. 1 is a block diagram illustrating the configuration of a conventional multi channel wide I/O semiconductor memory device.

For illustration purposes, FIG. 1 shows a multi channel wide I/O semiconductor memory device having four memory unit blocks.

Referring to FIG. 1, a multi channel wide I/O semiconductor memory device 100 includes first to fourth memory unit blocks 110, 120, 130, and 140.

The respective memory unit blocks 110, 120, 130, and 140 include core regions 112, 122, 132, and 142 having memory cell arrays, connection regions 116, 126, 136, and 146 for interface with external devices (not shown), and peripheral regions 114, 124, 134, and 144 having peripheral circuits serving as a medium between the core regions 112, 122, 132, and 142 and the connection regions 116, 126, 136 and 146. The external devices may include devices (e.g., memory modules) for transmitting/receiving data to/from the first to fourth memory unit blocks 110, 120, 130, and 140.

FIG. 2 is an internal configuration diagram explaining the connection of the peripheral regions 114, 124, 134, and 144 with the connection regions 116, 126, 136, and 146.

Since all of the peripheral regions 114, 124, 134, and 144 have the same configuration, FIG. 2 shows only the first peripheral region 114 and the first connection region 116 for convenience sake.

Referring to FIG. 2, the first connection region 116 includes a plurality of data pads DQ0 to DQK configured to receive data from an external device and output data to the external device. Bump pads may be used for the plurality of data pads DQ0 to DQK so as to minimize an area occupied by the pads.

The first peripheral region 114 includes a plurality of global input/output lines GIO<0>_CH0 to GIO<K>_CH0, a plurality of input/output circuits 114_1A to 114_K+1A, and a plurality of electrostatic discharge (ESD) protection circuits 114_1B to 114_K+1B. The plurality of global input/output lines GIO<0>_CH0 to GIO<K>_CH0 are provided in 1:1 correspondence with the plurality of data pads DQ0 to DQK.

The plurality of input/output circuits 114_1A to 114_K+1A are configured to load data applied through the plurality of data pads DQ0 to DQK on the plurality of global input/output lines GIO<0>_CH0 to GIO<K>_CH0 and output data applied through the plurality of global input/output lines GIO<0>_CH0 to GIO<K>_CH0 to the plurality of data pads DQ0 to DQK. The plurality of ESD protection circuits 114_1A to 114_k+1A are provided between the plurality of input/output circuits 114_1A to 114_k+1A and the plurality of data pads DQ0 to DQK and configured to protect the plurality of input/output circuits 114_1A to 114_k+1A from ESD flowing through the plurality of data pads DQ0 to DQK.

FIG. 3 is a block diagram illustrating the internal configuration of the first input/output circuit 114_1A of FIG. 2.

Referring to FIG. 3, the first input/output circuit 114_1A includes a first input circuit 114_1A_1 and a first output circuit 114_1A_2. The first input circuit 114_1A_1 is configured to load data, which is applied from the first data pad DQ0 and passes through the first ESD protection circuit 114_1B, on the first global input/output line GIO<0>_CH0. The first output circuit 114_1A_2 is configured to output data applied from the first global input/output line GIO<0>_CH0 to the first data pad DQ0.

The first input circuit 114_1A_1 includes a first input buffer unit 114_1A_11, a first delay unit 114_1A_13, and a first line driving unit 114_1A_15. The first input buffer unit 114_1A_11 is configured to buffer data applied from the first data pad DQ0. The first delay unit 114_1A_13 is configured to delay the data buffered by the first input buffer unit 114_1A_11 by a predetermined time. The first line driving unit 114_1A_15 is configured to drive potential/voltage to the first global input/output line GIO<0>_CH0 in response to the output signal of the first delay unit 114_1A_13. The first delay unit 114_1A_13 performs a delay operation based on a setup time and a hold time.

The first output circuit 114_1A_2 includes a first data alignment unit 114_1A_21, a first pre-driver 114_1A_23, and a first main driver 114_1A_25. The first data alignment unit 114_1A_21 is configured to align data loaded on the first global input/output line GIO<0>_CH0. The first pre-driver 114_1A_23 is configured to adjust a slew rate of data outputted from the first data alignment unit 114_1A_21. The first main driver 114_1A_25 is configured to adjust driving power of data outputted from the first pre-driver 114_1A_23.

In the conventional multi channel wide I/O semiconductor memory device 100, the first to fourth memory unit blocks 110, 120, 130, and 140 may perform data input/output operations independently without mutual influence and input/output data at wide bandwidth.

However, the conventional multi channel wide I/O semiconductor memory device 100 may use bump pads as the plurality of data pads DQ0 to DQK as described above. Since the bump pads are small in size than general data pads, it may be difficult to use the semiconductor memory device in the existing test environment. That is, since the bump pads are small in size, the multi channel wide I/O semiconductor memory device 100 may not be tested using the existing test equipment. Moreover, the existing test equipment may not have a test environment for testing independent operations of the multi channel wide I/O semiconductor memory device 100.

SUMMARY

An embodiment of the present invention is directed to a semiconductor memory device capable of establishing test environment suitable for multi channels with test equipment, and a test method thereof.

In accordance with an embodiment of the present invention, a semiconductor memory device includes: a plurality of first pads configured to input/output data in a test mode; and a plurality of memory unit blocks each including: a plurality of second pads configured to input/output data in a normal mode; and a plurality of data path selection units configured to connect internal circuits of the corresponding memory unit block to the plurality of first pads or the plurality of second pads in response to a unit block selection flag signal, a write enable signal, a read enable signal, and a mode control signal.

In accordance with another embodiment of the present invention, a semiconductor memory device includes: a plurality of first pads configured input/output first data in a test mode; a plurality of memory unit blocks each including: a plurality of second pads configured to input/output second data in a normal mode; a plurality of input circuits configured to transfer the first data or the second data to internal circuits of the corresponding memory unit block in response to corresponding input enable signals; a plurality of input path connection units configured to selectively connect the input circuits to the plurality of first pads in response to a mode control signal; and a plurality of output circuits configured to transfer the first and second data outputted from the internal circuits to the plurality of first pads and the plurality of second pads, respectively, in response to corresponding output enable signals and the mode control signal; and a plurality of common input/output units configured to transmit the first data between the plurality of first pads and the plurality of memory unit blocks.

In accordance with yet another embodiment of the present invention, a method for testing a semiconductor memory device having a plurality of memory unit blocks independently operating without mutual interference, includes: applying data through plurality of first pads of the semiconductor memory device in a test mode; simultaneously storing the applied data in the plurality of memory unit blocks in response to a plurality of input enable signals that are simultaneously activated; sequentially outputting the stored data from the plurality of memory unit blocks in response to a plurality of output enable signals that are sequentially activated; and providing the data sequentially outputted from the plurality of memory unit blocks through the first pads to the outside of the semiconductor memory device.

DETAILED DESCRIPTION

Figure 1:
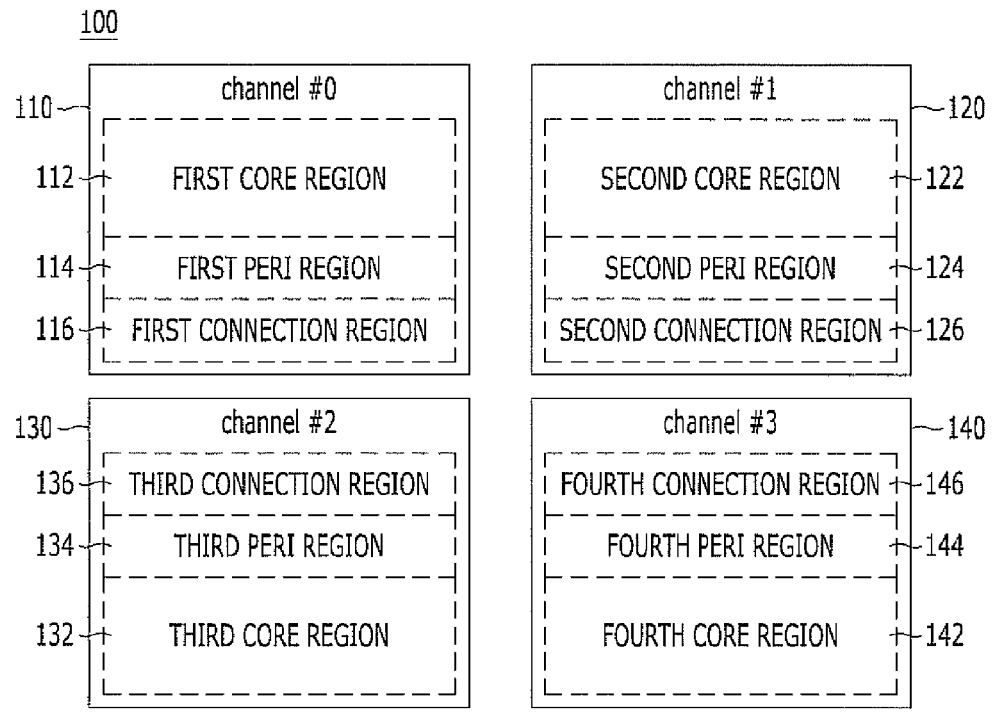
FIG. 1 is a block diagram illustrating the configuration of a conventional multi channel wide I/O semiconductor memory device.
Figure 2:
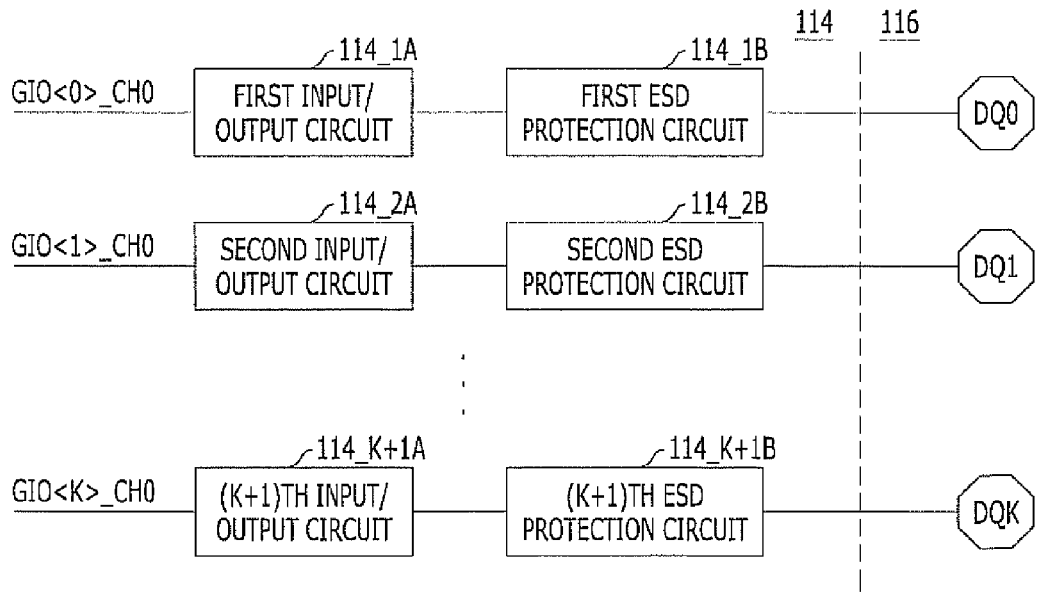
FIG. 2 is an internal configuration diagram illustrating a peripheral region and a connection region shown in FIG. 1.
Figure 3:
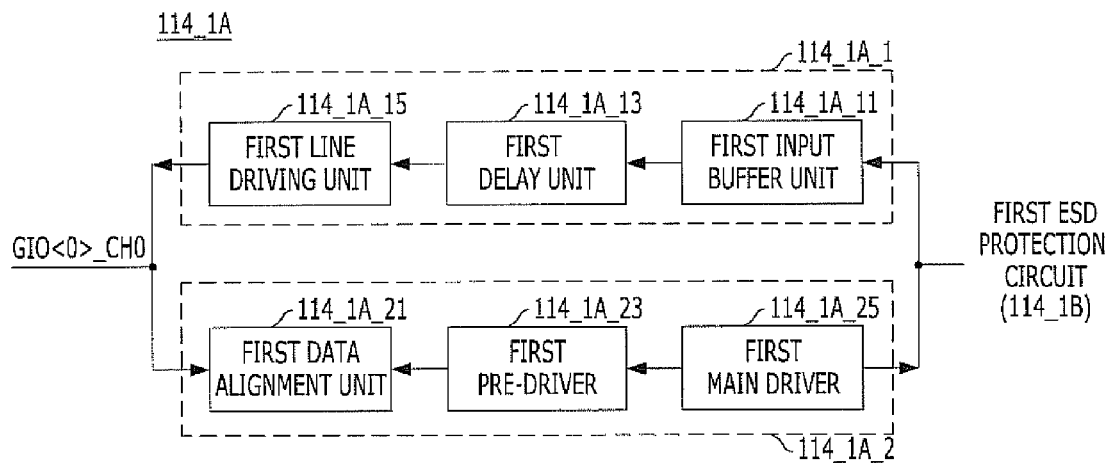
FIG. 3 is a block diagram exemplarily illustrating the configuration of a first input/output circuit shown in FIG. 2.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

For illustration purposes, a semiconductor memory device having four memory unit blocks is illustrated as follows according to an example.

Figure 4:
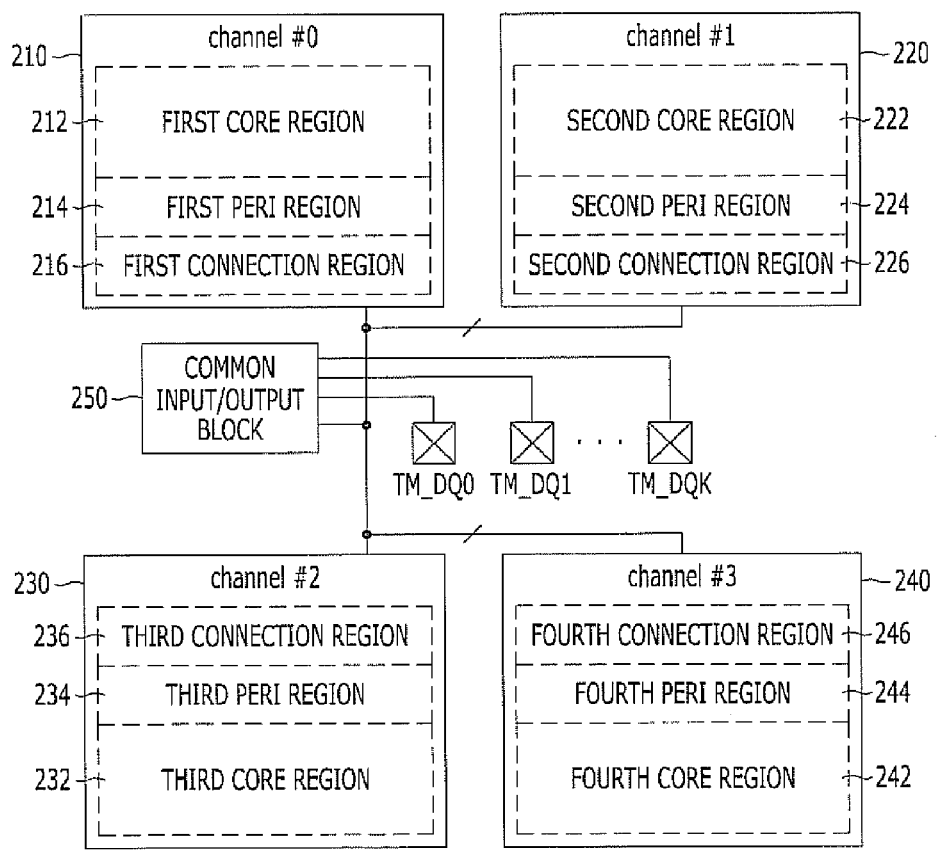
FIG. 4 is a block diagram illustrating the configuration of a semiconductor memory device in accordance with an embodiment of the present invention.

FIG. 4 is a block diagram conceptually explaining the configuration of a semiconductor memory device in accordance with an embodiment of the present invention.

Referring to FIG. 4, a semiconductor memory device 200 includes first to fourth memory unit blocks 210, 220, 230, and 240, a plurality of test mode pads TM_DQ0, TM_DQ1, . . . , TM_DQK, and a common input/output block 250. The first to fourth memory unit blocks 210, 220, 230 and 240 are configured to be independently operable without mutual interference. The plurality of test mode pads TM_DQ0, TM_DQ1, . . . , TM_DQK are configured to input/output data in a test mode. The common input/output block 250 is configured to input/output data between the first to fourth memory unit blocks 210, 220, 230, and 240 and the plurality of test mode pads TM_DQ0, TM_DQ1, . . . , TM_DQK. For reference, the semiconductor memory device having the first to fourth memory unit blocks 210, 220, 230, and 240 may be referred to as a multi channel wide I/O semiconductor memory device. The multi channels (channel #0, channel #1, channel #2, channel #3) represent the first to fourth memory unit blocks 210, 220, 230, and 240.

The first to fourth memory unit blocks 210, 220, 230, and 240 include core regions 212, 222, 232, and 242 having memory cell arrays, connection regions 216, 226, 236, and 246 for interface with external devices (not shown), and peripheral regions 214, 224, 234, and 244 having peripheral circuits serving as a medium between the core regions 212, 222, 232, and 242 and the connection regions 216, 226, 236, and 246. The external devices may include devices (e.g., memory modules) for transmitting/receiving data to/from the first to fourth memory unit blocks 210, 220, 230, and 240.

The plurality of test mode pads TM_DQ0, TM_DQ1, . . . , TM_DQK are data pads for a probe test and have a size suitable for a test using a general probe test equipment (not shown).

Figure 5:
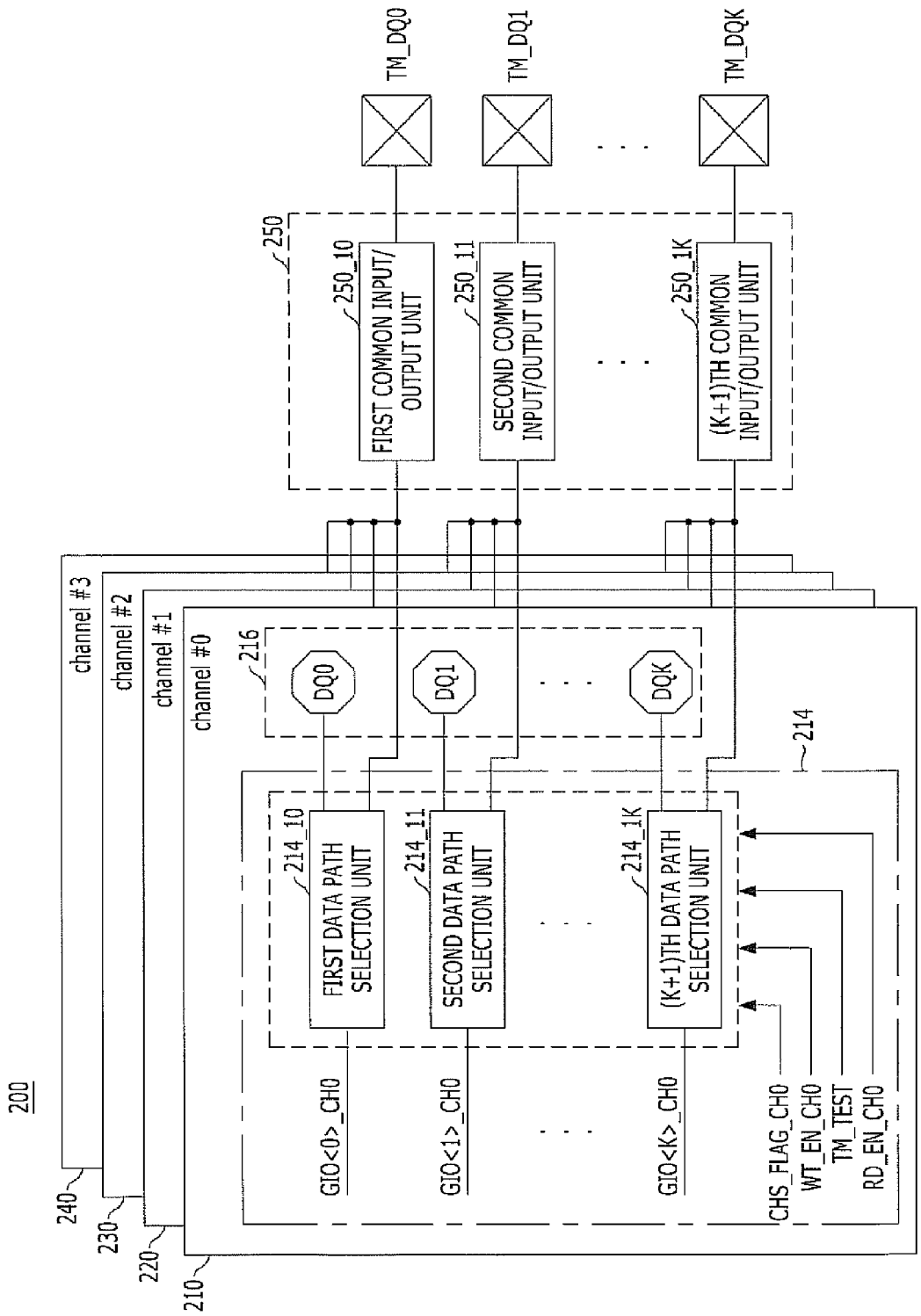
FIG. 5 is a block diagram illustrating the semiconductor memory device shown in FIG. 4 in more detail.

FIG. 5 is a block diagram explaining the configuration of the semiconductor memory device 200 of FIG. 4 in more detail. Since the first to fourth memory unit blocks 210, 220, 230, and 240 have the same configuration, FIG. 5 exemplarily shows the internal configuration of the first memory unit block 210. For convenience sake, only the peripheral region 214 and the connection region 216, except the core region 212, are illustrated in the first memory unit block 210.

Referring to FIG. 5, the first memory unit block 210, as mentioned above, includes the peripheral region 214 and the connection region 216. In the connection region 216, the plurality of data pads DQ0 to DQK are provided to input/output data in a normal mode. Hereinafter, the plurality of data pads DQ0 to DQK will be referred to as a plurality of normal mode pads. Bump pads may be used as the plurality of normal mode pads DQ0, DQ1, . . . , DQK in order to minimize an area occupied by the pads. The bump pads are configured to be smaller in size than the test mode pads. The plurality of normal mode pads DQ0, DQ1, . . . , DQK are provided in 1:1 correspondence with the plurality of test mode pads TM_DQ0, TM_DQ1, . . . , TM_DQK. Accordingly, the number of the normal mode pads DQ0, DQ1, . . . , DQK may be equal to the number of the test mode pads TM_DQ0, TM_DQ1, . . . , TM_DQK. The peripheral region 214 include a plurality of global input/output lines GIO<0>_CH0 to GIO<K>_CH0 and a plurality of data path selection units 214_10, 214_11, . . . , 214_1K. The plurality of global input/output lines GIO<0>_CH0~GIO<K>CH0 are provided in 1:1 correspondence with the plurality of normal mode pads DQ0, DQ1, . . . , DQK. The plurality of data path selection units 214_10, 214_11, . . . , 214_1K are configured to connect the global input/output lines GIO<0>_CH0 to GIO<K>_CH0 to the plurality of normal mode pads DQ0, DQ1, . . . , DQK or the common input/output block 250 in response to an unit block selection flag signal CHS_FLAG_CH0, a write enable signal WT_EN_CH0, a read enable signal RD_EN_CH0, and a mode control signal TM_TEST.

The common input/output block 250 includes a plurality of common input/output units 250_10, 250_11, . . . , 250_1K provided in 1:1 correspondence with the plurality of test mode pads TM_DQ0, TM_DQ1, . . . , TM_DQK. Each of the common input/output units 250_10, 250_11, . . . , 250_1K forms input/output paths with the corresponding data path selection units of the first to fourth memory unit blocks 210, 220, 230, and 240. For example, the first common input/output unit 250_10 may form the input/output paths with the first data path selection units 214_10, 224_10, 234_10, and 244_10, which are illustrated in FIG. 6.

Figure 6:
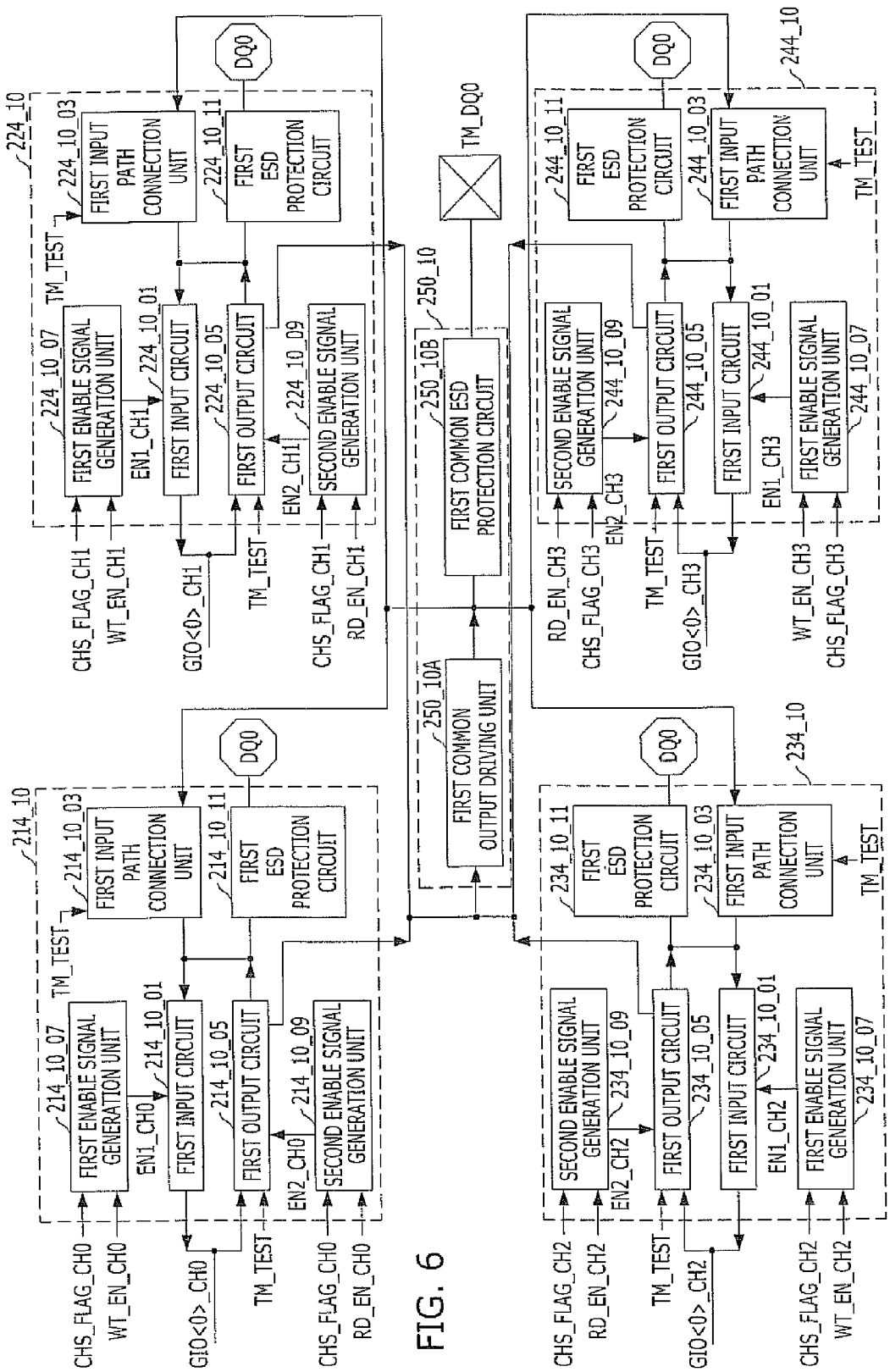
FIG. 6 is a block diagram illustrating a data path selection unit and common input/output unit shown in FIG. 5.

FIG. 6 is a block diagram exemplarily illustrating the connection relationships between the first common input/output unit 250_10 and the corresponding data path selection units 214_10, 224_10, 234_10, and 244_10 in the semiconductor memory device 200 of FIG. 5.

Referring to FIG. 6, the first data path selection units 214_10, 224_10, 234_10, and 244_10 are configured to share input paths and output paths from/to the first common input/output unit 250_10 each other. For more detailed explanation, the internal configuration of the first data path selection units 214_10, 224_10, 234_10, and 244_10 and the internal configuration of the first common input/output unit 250_10 are described as follows.

The first data path selection units 214_10, 224_10, 234_10, and 244_10 include first input circuits 214_10_01, 224_10_01, 234_10_01, and 244_10_01, first input path connection units 214_10_03, 224_10_03, 234_10_03, and 244_10_03, first output circuits 214_10_05, 224_10_05, 234_10_05, and 244_10_05, first ESD protection circuits 214_10_11, 224_10_11, 234_10_11, and 244_10_11, first enable signal generation units 214_10_07, 224_10_07, 234_10_07, and 244_10_07, and second enable signal generation units 214_10_09, 224_10_09, 234_10_09, and 244_10_09.

The first input circuits 214_10_01, 224_10_01, 234_10_01, and 244_10_01 are configured to load data from the first common input/output unit 250_10 or the first normal mode pads DQ0 on the global input/output lines GIO<0>_CH0, GIO<0>_CH1, GIO<0>_CH2, and GIO<0>_CH3 in response to input enable signals EN1_CH0, EN1_CH1, EN1_CH2, and EN1_CH3. The first input path connection units 214_10_03, 224_10_03, 234_10_03, and 244_10_03 are configured to selectively connect the first input circuits 214_10_01, 224_10_01, 234_10_01, and 244_10_01 to the first common input/output unit 250_10 in response to the mode control signal TM_TEST. The first output circuits 214_10_05, 224_10_05, 234_10_05, and 244_10_05 are configured to transfer data outputted through the global input/output lines GIO<0>_CH0, GIO_0>_CH1, GIO<0>_CH2, and GIO<0>_CH3 to the first common input/output unit 250_10 or the first normal mode pads DQ0 in response to output enable signals EN2_CH0, EN2_CH1, EN2_CH2, and EN2_CH3 and the mode control signal TM_TEST. The first ESD protection circuits 214_10_11, 224_10_11, 234_10_11, and 244_10_11 are provided between the first output circuits 214_10_05, 224_10_05, 234_10_05, and 244_10_05 and the first normal mode pads DQ0 to protect internal circuits from ESD flowing through the first normal mode pads DQ0.

The first enable signal generation units 214_10_07, 224_10_07, 234_10_07, and 244_10_07 are configured to generate the input enable signals EN1_CH0, EN1_CH1, EN1_CH2, and EN1_CH3 in response to the unit block selection flag signals CHS_FLAG_CH0, CHS_FLAG_CH1, CHS_FLAG_CH2, and CHS_FLAG_CH3 and the write enable signals WT_EN_CH0, WT_EN_CH1, WT_EN_CH2, and WT_EN_CH3. The second enable signal generation units 214_10_09, 224_10_09, 234_10_09, and 244_10_09 are configured to generate the output enable signals EN2_CH0, EN2_CH1, EN2_CH2, and EN2_CH3 in response to the unit block selection flag signals CHS_FLAG_CH0, CHS_FLAG_CH1, CHS_FLAG_CH2, and CHS_FLAG_CH3 and the read enable signals RD_EN_CH0, RD_EN_CH1, RD_EN_CH2, and RD_EN_CH3.

The first common input/output unit 250_10 includes a first common output driving unit 250_10A and first common ESD protection circuit 250_10B. The first common output driving unit 250_10A is configured to change a voltage level of data outputted from the first output circuits 214_10_05, 224_10_05, 234_10_05, and 244_10_05 depending on the external environment in which the first common output driving unit 250_10A is used. The first common ESD protection circuit 250_10B is provided between the first common output driving unit 250_10A and the first test mode pad TM_DQ0 to protect internal circuits from ESD flowing through the first test mode pad TM_DQ0.

An input terminal of the first common output driving unit 250_10A is connected to output terminals of the first output circuits 214_10_05, 224_10_05, 234_10_05, and 244_10_05 included in the first data paths selection units 214_10, 224_10, 234_10, and 244_10. A node between the first common output driving unit 250_10A and the first common ESD protection circuit 250_10B is connected to input terminals of the first input path connection units 214_10_03, 224_10_03, 234_10_03, and 244_10_03 included in the first data path selection units 214_10, 224_10, 234_10, and 244_10.

Meanwhile, the first common output driving unit 250_10A may be implemented with a pre-driver and a main driver. Since the pre-driver, the main driver, and the ESD protection circuit are implemented as well known in the art, detailed description thereof is omitted.

Figure 7:
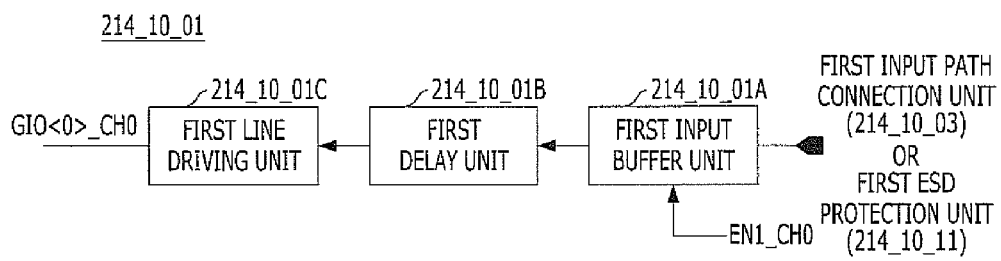
FIG. 7 is a block diagram exemplarily illustrating the configuration of a first input circuit shown in FIG. 6.

FIG. 7 is a block diagram exemplarily illustrating the configuration of the first input circuits 214_10_01, 224_10_01, 234_10_01, and 244_10_01 of FIG. 6.

Since the first input circuits 214_10_01, 224_10_01, 234_10_01, and 244_10_01 included in the first data path selection units 214_10, 224_10, 234_10 and 244_10 have the same configuration, FIG. 7 exemplarily illustrates the first input circuit 214_10_01 as follows.

Referring to FIG. 7, the first input circuit 214_10_01 includes a first input buffer unit 214_10_01A, a first delay unit 214_10_01B, and a first line driving unit 214_10_01C. The first input buffer unit 214_10_01A is configured to buffer data transferred from the first input path connection unit 214_10_03 or the first ESD protection circuit 214_10_11 in response to the input enable signal EN1_EN1_CH0. The first delay unit 214_10_01B is configured to delay the data buffered by the input buffer unit 214_10_01A by a predetermined time. The first line driving unit 214_10_01C is configured to drive potential/voltage to the global input/output line GIO<0>_CH0 in response to the output signal of the first delay unit 214_10_01B. The first delay unit 214_10_01B delays the data buffered by the input buffer unit 214_10_01A depending on a setup time and a hold time.

Figure 8:
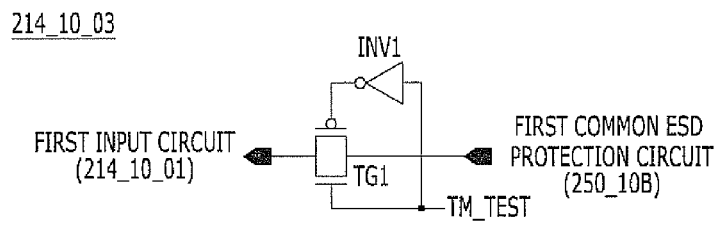
FIG. 8 is an internal circuit diagram exemplarily illustrating a first input path connection unit shown in FIG. 6.

FIG. 8 is a block diagram exemplarily illustrating the configuration of the first input path connection units 214_10_03, 224_10_03, 234_10_03, and 244_10_03 of FIG. 6.

Since the first input path connection units 214_10_03, 224_10_03, 234_10_03, and 244_10_03 included in the first data path selection units 214_10, 224_10, 234_10, and 244_10 have the same configuration, FIG. 8 exemplarily illustrates the first input path connection unit 214_10_03 included in the first data path selection unit 214_10 as follows.

Referring to FIG. 8, the first input path connection unit 214_10_03 includes an inverter INV1 and a transmission gate TG1. The inverter INV1 is configured to invert the mode control signal TM_TEST. The transmission gate TG1 is configured to selectively connect the first common ESD protection circuit 250_10B to the first input circuit 214_10_01 in response to the output signal of the inverter INV1 and the mode control signal TM_TEST.

Figure 9:
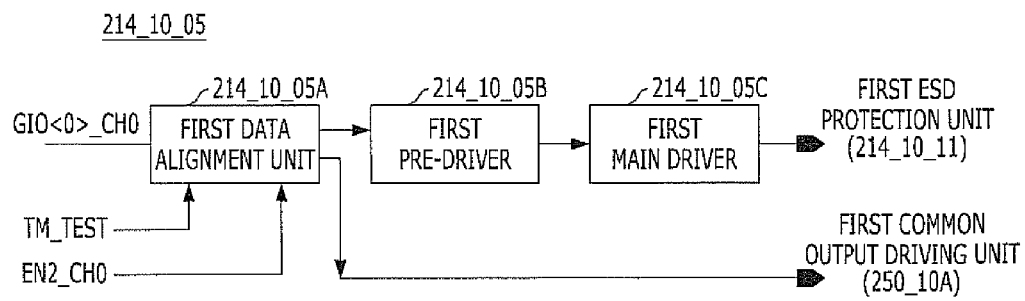
FIG. 9 is a block diagram exemplarily illustrating the configuration of a first output circuit shown in FIG. 6.

FIG. 9 is a block diagram exemplarily illustrating the configuration of the first output circuits 214_10_05, 224_10_05, 234_10_05, and 244_10_05 of FIG. 6.

Since the first output circuits 214_10_05, 224_10_05, 234_10_05, and 244_10_05 included in the first data path selection units 214_10, 224_10, 234_10, and 244_10 have the same configuration, FIG. 9 exemplarily illustrates the first output circuit 214_10_05 included in the first data path selection unit 214_10 as follows.

Referring to FIG. 9, the first output circuit 214_10_05 includes a first data alignment unit 214_10_05A and first data output driving units 214_10_05B and 214_10_05C. The first data alignment unit 214_10_05A is configured to align data loaded on the corresponding global input/output line GIO<0>_CH0, select a data output path to the first normal mode pad DQ0 or the first test mode pad TM_DQ0 in response to the mode control signal TM_TEST, and output the aligned data to the selected output path in response to the output enable signal EN2_CH0. The first data output driving units 214_10_05B and 214_10_05C are configured to output the data aligned by the first data alignment unit 214_10_05A to the first ESD protection circuit 214_10_11 in a normal mode in which the mode control signal TM_TEST is deactivated. The first data output driving units 214_10_05B and 214_10_05C may include a first pre-driver 214_10_05B and a first main driver 214_10_05C.

Figure 10:
FIG. 10 is a block diagram exemplarily illustrating the configuration of a first enable signal generation unit shown in FIG. 6.

FIG. 10 is a block diagram exemplarily illustrating the configuration of the first enable signal generation units 214_10_07, 224_10_07, 234_10_07, and 244_10_07.

Since the first enable signal generation units 214_10_07, 224_10_07, 234_10_07, and 244_10_07 included in the first data path selection units 214_10, 224_10, 234_10, and 244_10 have the same configuration, FIG. 10 exemplarily illustrates the first enable signal generation unit 214_10_07 included in the first data path selection unit 214_10 as follows.

Referring to FIG. 10, the first enable signal generation unit 214_10_07 includes a NAND gate NAND1 and an inverter INV2. The NAND gate NAND1 is configured to perform a NAND operation on the first unit block selection flag signal CHS_FLAG_CH0 and the first write enable signal WT_EN_CH0. The inverter INV2 is configured to invert the output signal of the NAND gate NAND1 and output the input enable signal EN1_CH0. The first enable signal generation unit 214_10_07 having the above-described configuration activates the input enable signal EN1_CH0 to a logic high level only when both of the first unit block selection flag signal CHS_FLAG_CH0 and the first write enable signal WT_EN_CH0 are activated to a logic high level.

Figure 11:
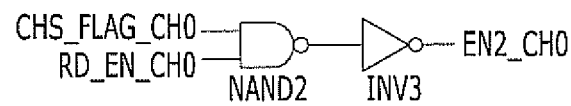
FIG. 11 is a block diagram exemplarily illustrating the configuration of a second enable signal generation unit shown in FIG. 6.

FIG. 11 is a block diagram exemplarily illustrating the configuration of the second enable signal generation units 214_10_09, 224_10_09, 234_10_09, and 244_10_09 of FIG. 6.

Since the second enable signal generation units 214_10_09, 224_10_09, 234_10_09, and 244_10_09 included in the first data path selection units 214_10, 224_10, 234_10, and 244_10 have the same configuration, FIG. 11 exemplarily illustrates the second enable signal generation unit 214_10_09 included in the first data path selection unit 214_10 as follows.

Referring to FIG. 10, the second enable signal generation unit 214_10_09 includes a NAND gate NAND2 and an inverter INV3. The NAND gate NAND2 is configured to perform a NAND operation on the first unit block selection flag signal CHS_FLAG_CH0 and the first read enable signal RD_EN_CH0. The inverter INV3 is configured to invert the output signal of the NAND gate NAND2 and output the output enable signal EN2_CH0. The second enable signal generation unit 214_10_09 having the above-described configuration activates the output enable signal EN2_CH0 to a logic high level only when both of the first unit block selection flag signal CHS_FLAG_CH0 and the first read enable signal RD_EN_CH0 are activated to a logic high level.

Hereinafter, the operation of the semiconductor memory device 200 configured as described above in accordance with the embodiment of the present invention is described with reference to FIG. 12. Particularly, the test mode operation of the semiconductor memory device is described in accordance with the embodiment of the present invention.

Figure 12:
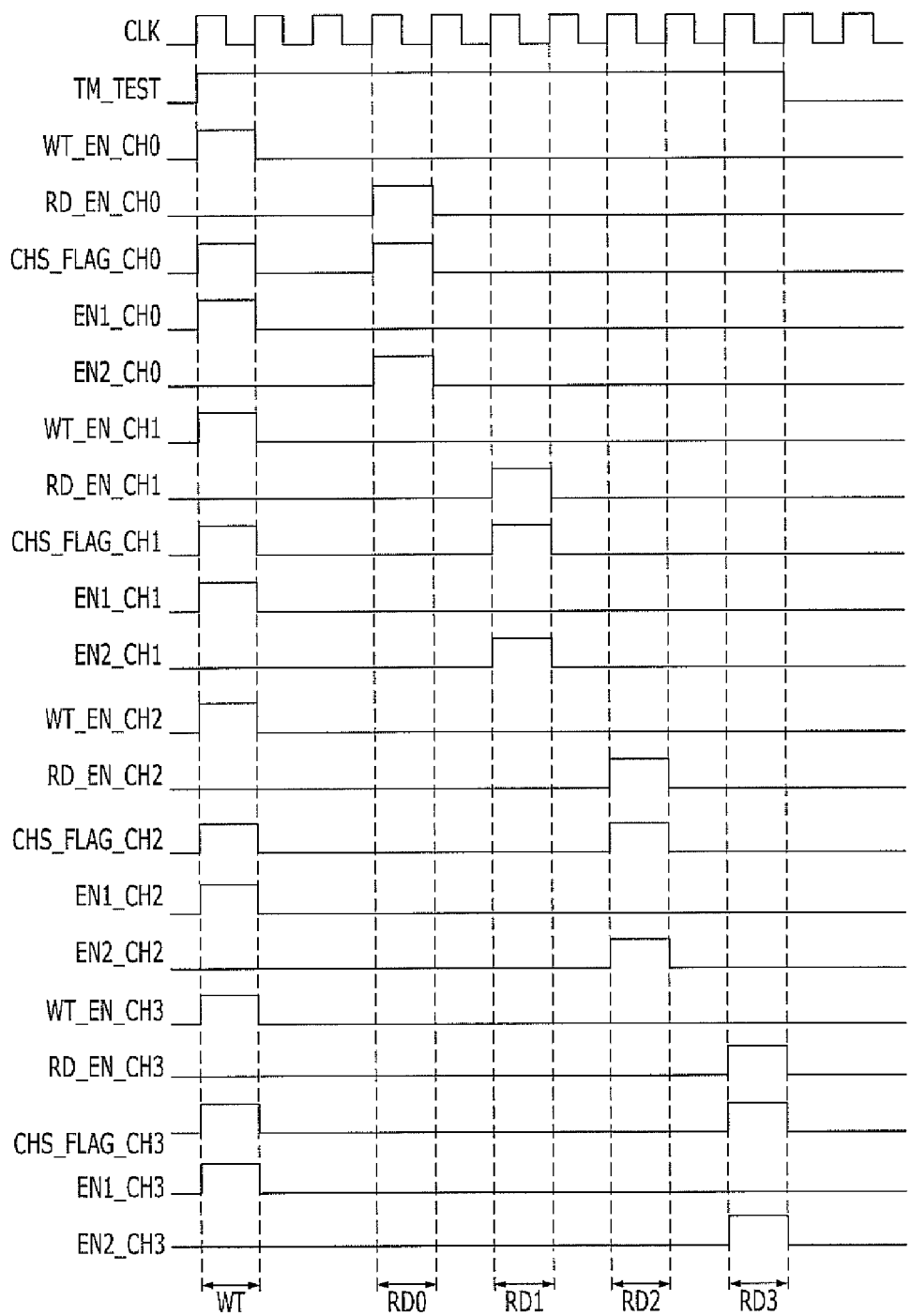
FIG. 12 is a timing diagram explaining a method for testing a semiconductor memory device in accordance with an embodiment of the present invention.

FIG. 12 is a timing diagram explaining a method for testing a semiconductor memory device 200 in accordance with an embodiment of the present invention.

Referring to FIG. 12, the method for testing the semiconductor memory device 200 includes: a write step WT of simultaneously storing data in a plurality of memory cells (not shown) included in the first to fourth core regions 212, 222, 232, and 242 in response to the input enable signals EN1_CH0, EN1_CH1, EN1_CH2, and EN1_CH3 that are simultaneously activated for the first to fourth memory unit blocks 210, 220, 230, and 240 when the data are applied through the plurality of test mode pads TM_DQ0, TM_DQ1, . . . , TM_DQK in a test mode; and read steps RD0, RD1, RD2, and RD3 of sequentially providing data, which are stored in the plurality of memory cells included in the first to fourth core regions 212, 222, 232, and 242, to the outside through the test mode pads TM_DQ0, TM_DQ1, ..., TM_DQK in response to the output enable signals EN2_CH0, EN2_CH1, EN2_CH2, and EN2_CH3 sequentially activated for the first to fourth memory unit blocks 210, 220, 230, and 240.

In the write step WT, the test time can be minimized because the data are simultaneously stored in the first to fourth memory unit blocks 210, 220, 230, and 240. In the read steps RD0, RD1, RD2, and RD3, since the data stored in the first to fourth memory unit blocks 210, 220, 230, and 240 are sequentially provided to the outside based on the memory unit blocks, confliction may be prevented among data outputted from the first to fourth memory unit blocks 210, 220, 230, and 240. Hereinafter, the above-described test method is described in more detail.

First, the write step WT is described as follows.

When the mode control signal TM_TEST is activated to a logic high level, the semiconductor memory device 200 enters the test mode. At the same time, all the input path connection units included in the first to fourth memory unit blocks 210, 220, 230, and 240 connect the corresponding input circuits to the corresponding common input/output units.

In this state, when test data is inputted through the plurality of test mode pads TM_DQ0, TM_DQ1, ..., TM_DQK, the data is transferred to all the input circuits through the plurality of common input/output units 250_10, 250_11, ..., 250_1K and the input path connection units connected to the plurality of common input/output units 250_10, 250_11, ..., 250_1K. As the first to fourth unit block selection flag signals CHS_FLAG_CH0, CHS_FLAG_CH1, CHS_FLAG_CH2, and CHS_FLAG_CH3 and the first to fourth write enable signals WT_EN_CH0, WT_EN_CH1, WT_EN_CH2, and WT_EN_CH3 are simultaneously activated, all the input enable signals EN1_CH0, EN1_CH1, EN1_CH2, and EN1_CH3 are activated. Accordingly, all the input circuits are enabled so that data transferred from the input path connection units are loaded on the corresponding global input/output lines. The data loaded on the respective global input/output lines are finally stored in the plurality of memory cells included in the first to fourth core regions 212, 222, 232, and 242.

Accordingly, the test time can be minimized because the test data are simultaneously stored in the first to fourth memory unit blocks 210, 220, 230, and 240.

Meanwhile, the output enable signals EN2_CH0, EN2_CH1, EN2_CH2, and EN2_CH3 maintain a deactivated state of a logic low level in order that the data loaded on the respective global input/output lines are not transferred to the corresponding output circuits. That is, since the read enable signals RD_EN_CH0, RD_EN_CH1, RD_EN_CH2, and RD_EN_CH3 are deactivated to a logic low level, the output enable signals EN2_CH0, EN2_CH1, EN2_CH2, and EN2_CH3 make all the output circuits maintained at a deactivated state.

The read steps RD0, RD1, RD2, and RD3 are described as follows.

After the write step WT is completed, the first to fourth read enable signals RD_EN_CH0, RD_EN_CH1, RD_EN_CH2, and RD_EN_CH3 and the first to fourth unit block selection flag signals CHS_FLAG_CH0, CHS_FLAG_CH1, CHS_FLAG_CH2, and CHS_FLAG_CH3 are sequentially activated based on the first to fourth memory unit blocks 210, 220, 230, and 240.

The output enable signals EN2_CH0, EN2_CH1, EN2_CH2, and EN2_CH3 are sequentially activated based on the first to fourth memory unit blocks 210, 220, 230, and 240, and all the output circuits included in the first to fourth memory unit blocks 210, 220, 230, and 240 are sequentially enabled so that the data loaded on the respective global input/output lines are outputted to the common input/output units 250_10, 250_11, ..., 250_1K in response to the output enable signals. To be specific, firstly, the output circuits 214_10_05, 214_11_05, ..., 214_1K_05 included in the first memory unit block 210 output the data loaded on the respective global input/output lines GIO<0>_CH0, GIO<1>_CH0, ..., GIO<K>_CH0 to the common input/output units 250_10, 250_11, ..., 250_1K in response to the output enable signal EN2_CH0 for the first memory unit block 210. Secondly, the output circuits 224_10_05, 224_11_05, ..., 224_1K_05 included in the second memory unit block 220 output the data loaded on the respective global input/output lines GIO<0>_CH1, GIO<1>_CH1, ..., GIO<K>_CH1 to the common input/output units 250_10, 250_11, ..., 250_1K in response to the output enable signal EN2_CH1 for the second memory unit block 220. Third, the output circuits 234_10_05, 234_11_05, 234_1K_05 included in the third memory unit block 230 output the data loaded on the respective global input/output lines GIO<0>_CH2, GIO<1>_CH2, ..., GIO<K>_CH2 to the common input/output units 250_10, 250_11, ..., 250_1K in response to the output enable signal EN2_CH2 for the third memory unit block 230. Fourth, the output circuits 244_10_05, 244_11_05, ..., 244_1K_05 included in the fourth memory unit block 240 output the data loaded on the respective global input/output lines GIO<0>_CH3, GIO<1>_CH3, ..., GIO<K>_CH3 to the common input/output units 250_10, 250_11, ..., 250_1K in response to the output enable signal EN2_CH3 for the fourth memory unit block 240.

Accordingly, the data may be sequentially outputted from the first to fourth memory unit blocks 210, 220, 230, and 240 to the outside through the test mode pads TM_DQ0, TM_DQ1, ..., TM_DQK without confliction.

Meanwhile, the input enable signals EN1_CH0, EN1_CH1, EN1_CH2, and EN1_CH3 are maintained at a deactivated state of a logic low level in order that the data applied to the common input/output units 250_10, 250_11, ..., 250_1K are not transferred to the corresponding input circuits. That is, since the write enable signals WT_EN_CH0, WT_EN_CH1, WT_EN_CH2, and WT_EN_CH3 are deactivated to a logic low level, the input enable signals EN1_CH0, EN1_CH1, EN1_CH2, and EN1_CH3 make all the input circuits maintained at a deactivated state.

In accordance with exemplary embodiments of the present invention, a multi channel wide I/O semiconductor memory device may use the probe test pad suitable for the existing test equipment and reduce costs caused for test equipments.

In addition, the semiconductor memory device having multi channels is provided with the test pad and the interface for test environment suitable for multi channels. Hence, the existing test equipment may be used. Therefore, additional costs for developing the test equipment that tests the multi channel wide I/O semiconductor memory device and manufacture costs for the multi channel wide I/O semiconductor memory device may be reduced. Consequently, the total manufacturing costs for the semiconductor memory device may be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a plurality of first pads configured to input/output data in a test mode; and
   a plurality of memory unit blocks each comprising:
      a plurality of second pads configured to input/output data in a normal mode; and
      a plurality of data path selection units configured to connect internal circuits of the corresponding memory unit block to the plurality of first pads or the plurality of second pads in response to a unit block selection flag signal, a write enable signal, a read enable signal, and a mode control signal.

2. The semiconductor memory device of claim 1, wherein the plurality of first pads are larger in size than the plurality of second pads.

3. The semiconductor memory device of claim 2, wherein the plurality of first pads comprise probe test pads.

4. The semiconductor memory device of claim 2, wherein the plurality of second pads comprise bump pads.

5. The semiconductor memory device of claim 1, wherein the number of the plurality of first pads is equal to the number of the plurality of second pads.

6. The semiconductor memory device of claim 1, wherein each of the plurality of memory unit blocks comprises:
   a core region comprising a plurality of memory cells;
   a peripheral region comprising the plurality of data path selection units; and
   a connection region comprising the plurality of second pads, and
   wherein the internal circuit comprises the plurality of memory cells.

7. The semiconductor memory device of claim 6, wherein each of the plurality of memory unit blocks further comprises an electrostatic discharge (ESD) protection circuit disposed between the plurality of second pads and the plurality of data path selection units in the peripheral region.

8. The semiconductor memory device of claim 6, wherein the connection unit is disposed at one side of the memory unit block.

9. A semiconductor memory device comprising:
   a plurality of first pads configured to input/output first data in a test mode;
   a plurality of memory unit blocks each comprising:
      a plurality of second pads configured to input/output second data in a normal mode;
      a plurality of input circuits configured to transfer the first data or the second data to internal circuits of the corresponding memory unit block in response to corresponding input enable signals;
      a plurality of input path connection units configured to selectively connect the input circuits to the plurality of first pads in response to a mode control signal; and
      a plurality of output circuits configured to transfer the first and second data outputted from the internal circuits to the plurality of first pads and the plurality of second pads, respectively, in response to corresponding output enable signals and the mode control signal; and
   a plurality of common input/output units configured to transmit the first data between the plurality of first pads and the plurality of memory unit blocks.

10. The semiconductor memory device of claim 9, wherein each of the plurality of memory unit blocks comprises:
    a core region comprising a plurality of memory cells;
    a peripheral region comprising the plurality of input circuits, the plurality of input path connection units, and the plurality of output circuits; and
    a connection region comprising the plurality of second pads, and
    wherein the internal circuit comprises the plurality of memory cells.

11. The semiconductor memory device of claim 10, wherein each of the plurality of memory unit blocks further comprises:
    a plurality of first enable signal generation units provided in the peripheral region and configured to generate the corresponding input enable signals in response to a corresponding unit block selection flag signal and a corresponding write enable signal; and
    a plurality of second enable signal generation units provided in the peripheral region and configured to generate the corresponding output enable signals in response to the corresponding unit block selection flag signal and a corresponding read enable signal.

12. The semiconductor memory device of claim 10, wherein each of the plurality of memory unit blocks further comprises electrostatic discharge (ESD) protection circuits disposed between the plurality of output circuits and the plurality of second pads in the peripheral region.

13. The semiconductor memory device of claim 10, wherein each of the plurality of input circuits comprises:
    an input buffer unit configured to buffer the first data or the second date in response to the input enable signal;
    a delay unit configured to delay the data buffered by the corresponding input buffer unit by a set time; and
    a line driving unit configured to drive a voltage of a corresponding global input/output line in response to an output signal of the delay unit.

14. The semiconductor memory device of claim 13, wherein the set time is a delay time corresponding to a setup time and a hold time.

15. The semiconductor memory device of claim 10, wherein each of the plurality of output circuits comprises:
    a data alignment unit configured to align data loaded on a corresponding global input/output line, select one of data output paths to the first pad and the second pad in response to the mode control signal, and output the aligned data to the selected output path in response to the corresponding output enable signal; and
    a data output driving unit configured to output the aligned data outputted by the data alignment unit to the second pad in the normal mode in which the mode control signal is deactivated.

16. The semiconductor memory device of claim 15, wherein the data output driving unit comprises a pre-driver and a main driver.

17. The semiconductor memory device of claim 15, wherein each of the plurality of common input/output units comprises:
    a common output driving unit configured to convert the aligned data outputted from the corresponding data alignment unit to have a set voltage level; and
    a common electrostatic discharge (ESD) protection circuit provided between the common output driving unit and the first pad and configured to protect the common output driving unit and the plurality of input path connection units from ESD flowing through the first pad.

18. The semiconductor memory device of claim 17, wherein the common output driving unit comprises a pre-driver and a main driver.

19. The semiconductor memory device of claim 17, wherein the plurality of common ESD protection circuits are configured to protect the common output driving unit and the plurality of input path connection units from the ESD in a write operation and a read operation.

20. The semiconductor memory device of claim 9, wherein each of the plurality of common input/output units is commonly connected to the corresponding input path connection unit and output circuit included in the plurality of memory unit blocks.

21. A method for testing a semiconductor memory device having a plurality of memory unit blocks independently operating without mutual interference, the method comprising:
   applying data through a plurality of first pads of the semiconductor memory device in a test mode;
   simultaneously storing the applied data in the plurality of memory unit blocks in response to a plurality of input enable signals that are simultaneously activated;
   sequentially outputting the stored data from the plurality of memory unit blocks in response to a plurality of output enable signals that are sequentially activated; and
   providing the data sequentially outputted from the plurality of memory unit blocks through the first pads to the outside of the semiconductor memory device.

22. The method of claim 21, wherein the plurality of input enable signals are generated by a combination of corresponding unit block selection flag signals and corresponding write enable signals.

23. The method of claim 21, wherein the plurality of output enable signals are generated by a combination of corresponding unit block selection flag signals and corresponding read enable signals.

* * * * *